US009151801B2

(12) United States Patent
Ishida et al.

(10) Patent No.: US 9,151,801 B2
(45) Date of Patent: Oct. 6, 2015

(54) MEASUREMENT CIRCUIT AND TEST APPARATUS

(75) Inventors: Masahiro Ishida, Gunma (JP); Kiyotaka Ichiyama, Gunma (JP)

(73) Assignee: ADVANTEST CORPORATION, Tokyo (JP)

(*) Notice: Subject to any disclaimer, the term of this patent is extended or adjusted under 35 U.S.C. 154(b) by 1141 days.

(21) Appl. No.: 13/165,796

(22) Filed: Jun. 22, 2011

(65) Prior Publication Data

US 2012/0161800 A1 Jun. 28, 2012

Related U.S. Application Data

(63) Continuation of application No. PCT/JP2010/004516, filed on Jul. 12, 2010.

(51) Int. Cl.
*G01R 31/319* (2006.01)
*G01R 31/3193* (2006.01)
*G01R 31/317* (2006.01)

(52) U.S. Cl.
CPC .... *G01R 31/31932* (2013.01); *G01R 31/31703* (2013.01); *G01R 31/31924* (2013.01)

(58) Field of Classification Search
CPC ................... G01R 31/317–31/31937
USPC ........ 324/750.01–762.1; 327/77, 78, 88, 141, 327/161, 205
See application file for complete search history.

(56) References Cited

U.S. PATENT DOCUMENTS

| 5,666,075 | A  | * | 9/1997  | Schinzel  | 327/77     |
|-----------|----|---|---------|-----------|------------|
| 6,498,473 | B1 | * | 12/2002 | Yamabe    | 324/750.01 |
| 6,549,000 | B2 | * | 4/2003  | Ebiya     | 324/750.02 |
| 7,549,099 | B2 | * | 6/2009  | Kantake   | 714/737    |
| 2010/0048142 | A1 | * | 2/2010  | Hou et al. | 455/67.13 |
| 2010/0312507 | A1 | * | 12/2010 | Uematsu   | 702/79     |
| 2011/0199134 | A1 | * | 8/2011  | Watanabe  | 327/144    |

FOREIGN PATENT DOCUMENTS

JP  2001-099894 A  4/2001
WO  WO 2010026642 A1 * 3/2010 ......... G01R 31/3193

OTHER PUBLICATIONS

International Preliminary Report on Patentability including the translation of the Written Opinion of the International Searching Authority for application No. PCT/JP2010/004516.

* cited by examiner

*Primary Examiner* — Huy Q Phan
*Assistant Examiner* — James Split

(57) ABSTRACT

Provided is a measurement circuit that measures a signal under measurement input thereto, comprising a level comparing section that outputs a logic value according to a comparison result between a signal level of the signal under measurement and a set threshold level; a logic comparing section that acquires the logic value output by the level comparing section at a comparison timing input thereto; and a timing adjusting section that adjusts relative phases of a signal output by the level comparing section and the comparison timing, based on the expected value pattern of the signal under measurement and the threshold level.

13 Claims, 14 Drawing Sheets

|  | VTH1 | VTH2 | ... | VTHm |
|---|---|---|---|---|
| P1 | $D_{11}$ | $D_{12}$ | ... | $D_{1m}$ |
| P2 | $D_{21}$ | $D_{22}$ | ... | $D_{2m}$ |
| ⋮ | ⋮ | ⋮ | ⋮ | ⋮ |
| Pn | $D_{n1}$ | $D_{n2}$ | ... | $D_{nm}$ |

MEASUREMENT CIRCUIT AND TEST APPARATUS

BACKGROUND

1. Technical Field

The present invention relates to a measurement circuit and a test apparatus.

2. Related Art

In a test apparatus for testing a device under test, a comparator is used to convert an output signal from the device under test into a digital signal by comparing the level of the output signal to a reference level, as shown in Patent Document 1, for example.

Patent Document 1: Japanese Patent Application Publication No. 2001-99894

The logic value output by the comparator changes when the magnitude relationship between the level of the input signal and the reference level changes. The response time, from when this magnitude relationship between the input signal level and the reference level changes until when the logic value output by the comparator changes, depends on the overdrive amount, which is the amount by which the input signal level exceeds the reference level.

More specifically, a greater overdrive amount results in the comparator having a faster response time. Therefore, the response time of the comparator changes according to the signal level input thereto, and so the signal input to the comparator cannot always be accurately converted into a digital signal.

One idea for solving this problem involves decreasing the absolute value of the response time variation by improving the gain of the comparator to obtain an even faster response time for the comparator. However, the response time variation cannot be reduced to zero. Therefore, problems can occur when inputting a high-frequency signal into the comparator, for example. Furthermore, there is a limit to how fast the response time can become as a result of improving the comparator capability.

SUMMARY

Therefore, it is an object of an aspect of the innovations herein to provide a measurement circuit and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a measurement circuit that measures a signal under measurement input thereto, comprising a level comparing section that outputs a logic value according to a comparison result between a signal level of the signal under measurement and a set threshold level; a logic comparing section that acquires the logic value output by the level comparing section at a comparison timing input thereto; and a timing adjusting section that adjusts relative phases of a signal output by the level comparing section and the comparison timing, based on the expected value pattern of the signal under measurement and the threshold level.

According to a second aspect related to the innovations herein, provided is a measurement circuit that measures a signal under measurement input thereto, comprising a level comparing section that outputs a logic value according to a comparison result between a signal level of the signal under measurement and a set threshold level; a logic comparing section that acquires the logic value output by the level comparing section at a comparison timing input thereto; and a timing adjusting section that corrects timing information of the comparison result from the logic comparing section, based on an expected value pattern of the signal under measurement and the threshold level.

According to a third aspect related to the innovations herein, provided is a test apparatus that tests a device under test, comprising a pattern generating section that generates a test pattern signal to be input to the device under test; the measurement circuit according to the first or second aspect that measures a signal under measurement output by the device under test in response to the test pattern signal; and a judging section that judges pass/fail of the device under test based on a result of the measurement by the measurement circuit.

The summary clause does not necessarily describe all necessary features of the embodiments of the present invention. The present invention may also be a sub-combination of the features described above.

BRIEF DESCRIPTION OF THE DRAWINGS

FIG. 5 shows exemplary characteristic information stored by the characteristic information storage section 30.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
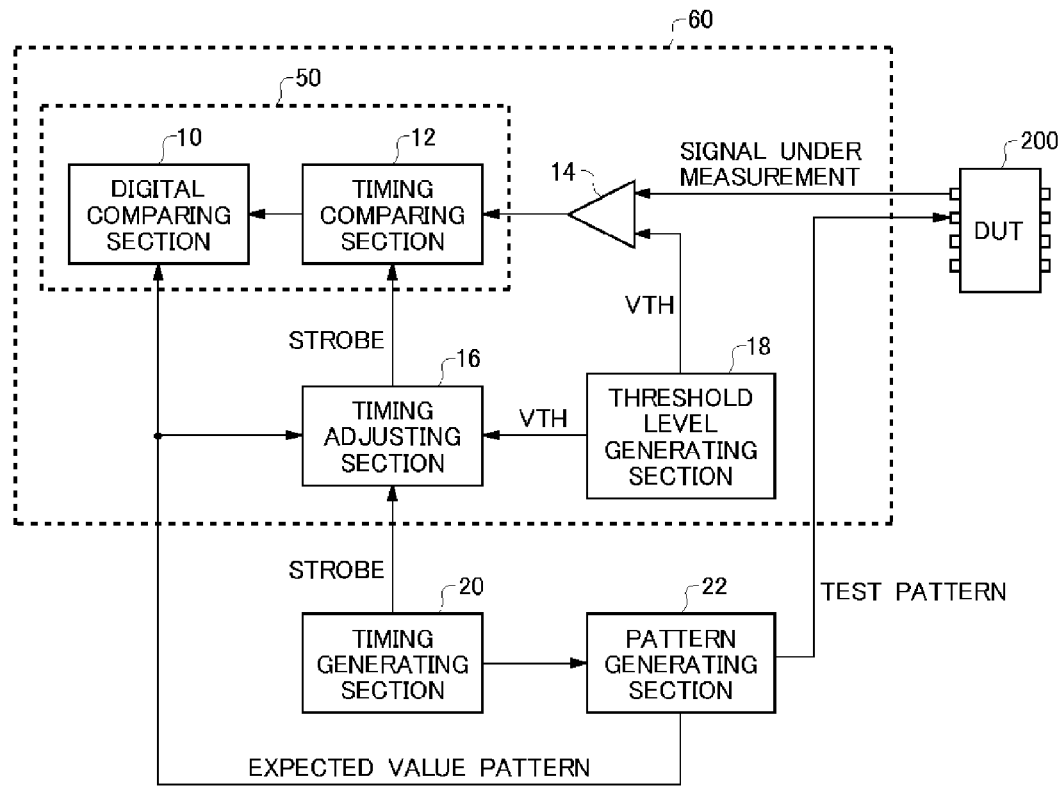
FIG. 1 shows an exemplary configuration of a test apparatus 100 that tests a device under test 200, such as a semiconductor chip, along with the device under test 200.

FIG. 1 shows an exemplary configuration of a test apparatus 100 that tests a device under test 200, such as a semiconductor chip, along with the device under test 200. The test apparatus 100 includes a timing generating section 20, a pattern generating section 22, and a measurement circuit 60.

The timing generating section 20 generates a timing signal that defines a timing at which a signal is input to the device under test 200. The timing generating section 20 generates a strobe signal that designates a timing at which a signal under measurement output from the device under test 200 is measured.

The pattern generating section 22 generates a test pattern signal having a prescribed logic pattern, and inputs the test pattern signal to the device under test 200. The frequency of the test pattern signal may be an integer multiple or an integer fraction of a predetermined test cycle. The present embodiment describes an example in which the test pattern signal has the same frequency as the test cycle. The timing of each edge of the test pattern signal is determined according to the timing signal generated by the timing generating section 20 for each test cycle.

The measurement circuit 60 measures a signal under measurement received from the device under test 200. For example, the measurement circuit 60 may measure a logic pattern of the signal under measurement. The measurement circuit 60 includes a level comparing section 14, a timing adjusting section 16, a threshold level generating section 18, and a logic comparing section 50.

The level comparing section 14 outputs a logic value corresponding to the comparison result between the signal level of the signal under measurement and a set threshold level VTH. For example, the level comparing section 14 may output logic H when the signal level of the signal under measurement is greater than the threshold level and output logic L when the signal level of the signal under measurement is less than or equal to the threshold level.

The threshold level generating section 18 generates a voltage that has a set threshold level, and supplies this voltage to the level comparing section 14. For example, the threshold level generating section 18 may generate the voltage using a variable voltage source.

The logic comparing section 50 acquires a logic value pattern obtained by sampling the logic value output by the level comparing section 14 at the received comparison timing. The logic comparing section 50 compares the acquired logic value pattern to a received expected value pattern. The logic comparing section 50 includes a timing comparing section 12 that acquires the logic value pattern and a digital comparing section 10 that compares the logic value pattern to the expected value pattern.

The timing generating section 20 may generate a strobe signal that defines the comparison timing of the timing comparing section 12. The timing generating section 20 may generate one or more strobe signals for each test cycle. The timing generating section 20 of the present embodiment generates one strobe signal for each test cycle.

The timing generating section 20 may generate timing information that indicates a time position of the strobe signal within each test cycle. The timing information is set with a finer resolution than the test cycle. The timing generating section 20 may include a plurality of variable delay circuits that delay the timing signal and the strobe signal. The timing comparing section 12 may sample the signal output by the level comparing section 14, at a timing of each rising edge of the strobe signal.

The pattern generating section 22 generates an expected value pattern indicating the logic value pattern expected for the signal under measurement output by the device under test 200, and supplies the expected value pattern to the digital comparing section 10. The pattern generating section 22 generates the expected value pattern according to a test pattern input to the device under test 200.

The timing adjusting section 16 adjusts the relative phases of the comparison timing and the signal output by the level comparing section 14, based on the expected value pattern generated by the pattern generating section 22 and the threshold level VTH generated by the threshold level generating section 18, and inputs the resulting signal and timing to the timing comparing section 12. The timing adjusting section 16 preferably performs this timing adjustment for each strobe signal.

Figure 2:
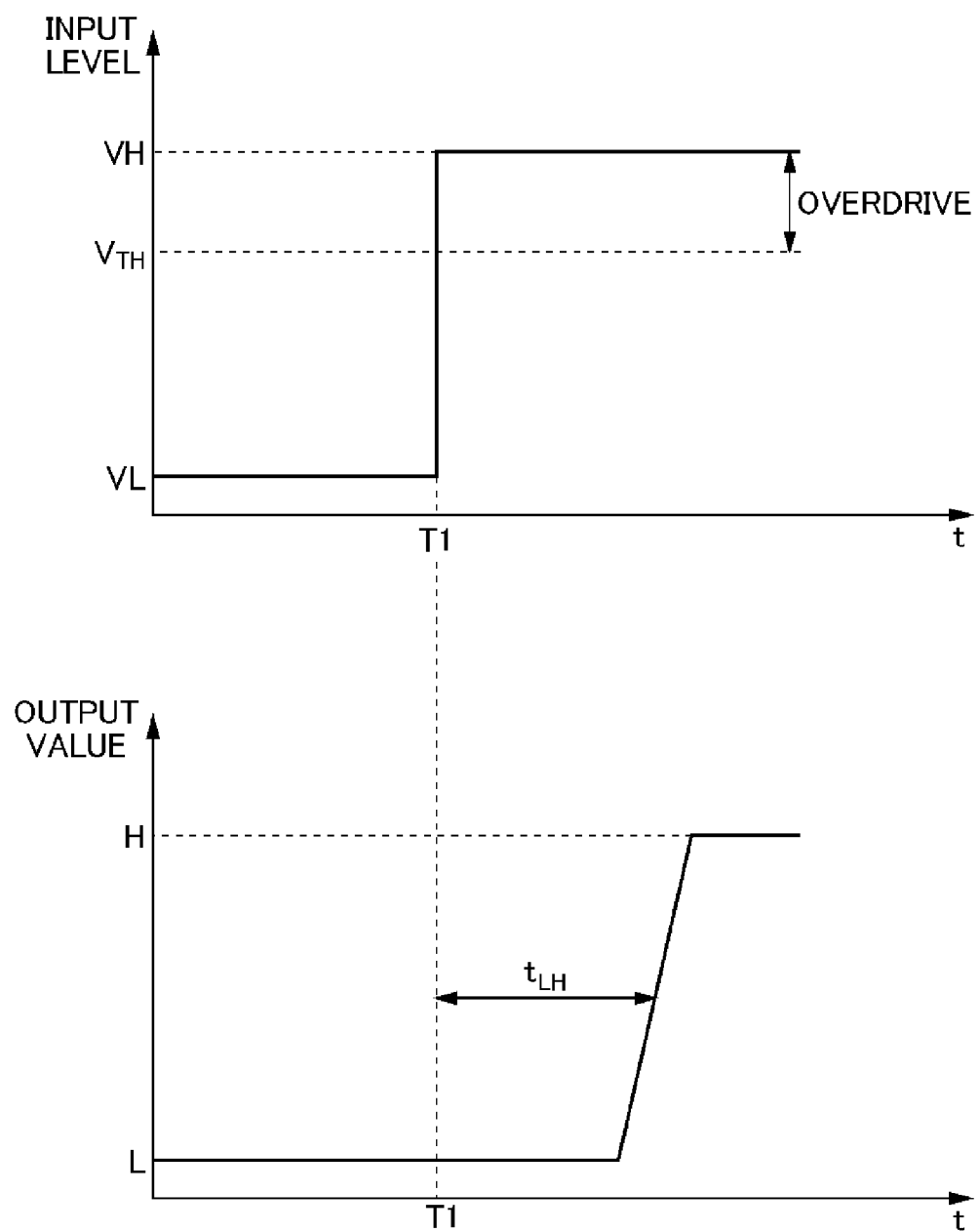
FIG. 2 shows a relationship between the overdrive amount in the level comparing section 14 and the response speed of the level comparing section 14.

FIG. 2 shows a relationship between the overdrive amount of the level comparing section 14 and the response speed of the level comparing section 14. The waveform in the upper portion of FIG. 2 is a waveform of the signal under measurement input to the level comparing section 14, and the waveform in the lower portion of FIG. 2 is a waveform of the signal output by the level comparing section 14.

As shown in FIG. 2, the overdrive amount indicates an amount by which the level of the signal under measurement input to the level comparing section 14 exceeds the threshold level VTH. When the level of the signal under measurement changes from being less than or equal to the threshold value to being greater than the threshold value, the logic value output by the level comparing section 14 changes from logic L to logic H.

However, the delay tLH, which is the delay of the timing at which the logic value output by the level comparing section 14 changes with respect to the timing T1 at which the level of the signal under measurement changes, changes according to the overdrive amount. For example, the delay tLH is smaller when the overdrive amount is larger.

The timing adjusting section 16 compensates for the delay tLH of the level comparing section 14 by adjusting the relative phases of the signal output by the level comparing section 14 and the strobe signal. For example, the timing adjusting section 16 may set a delay amount for the strobe signal according to the delay tLH of the level comparing section 14. In this way, the timing adjusting section 16 can compensate for change in the delay amount tLH corresponding to change in the overdrive amount of the level comparing section 14.

As described above, the delay amount tLH of the level comparing section 14 depends on the overdrive amount. The overdrive amount can be calculated from the signal level of the signal under measurement and the threshold level VTH of the level comparing section 14. Furthermore, the logic value pattern of the signal under measurement can be estimated from the expected value pattern generated according to the test pattern, and therefore the signal level of the signal under measurement can be estimated from the logic value of the expected value pattern.

As a result, by adjusting the relative phases of the signal output by the level comparing section 14 and the comparison timing based on the threshold level VTH generated by the threshold level generating section 18 and the expected value pattern generated by the pattern generating section 22, the timing adjusting section 16 can accurately compensate for the delay tLH of the level comparing section 14.

Figure 3:
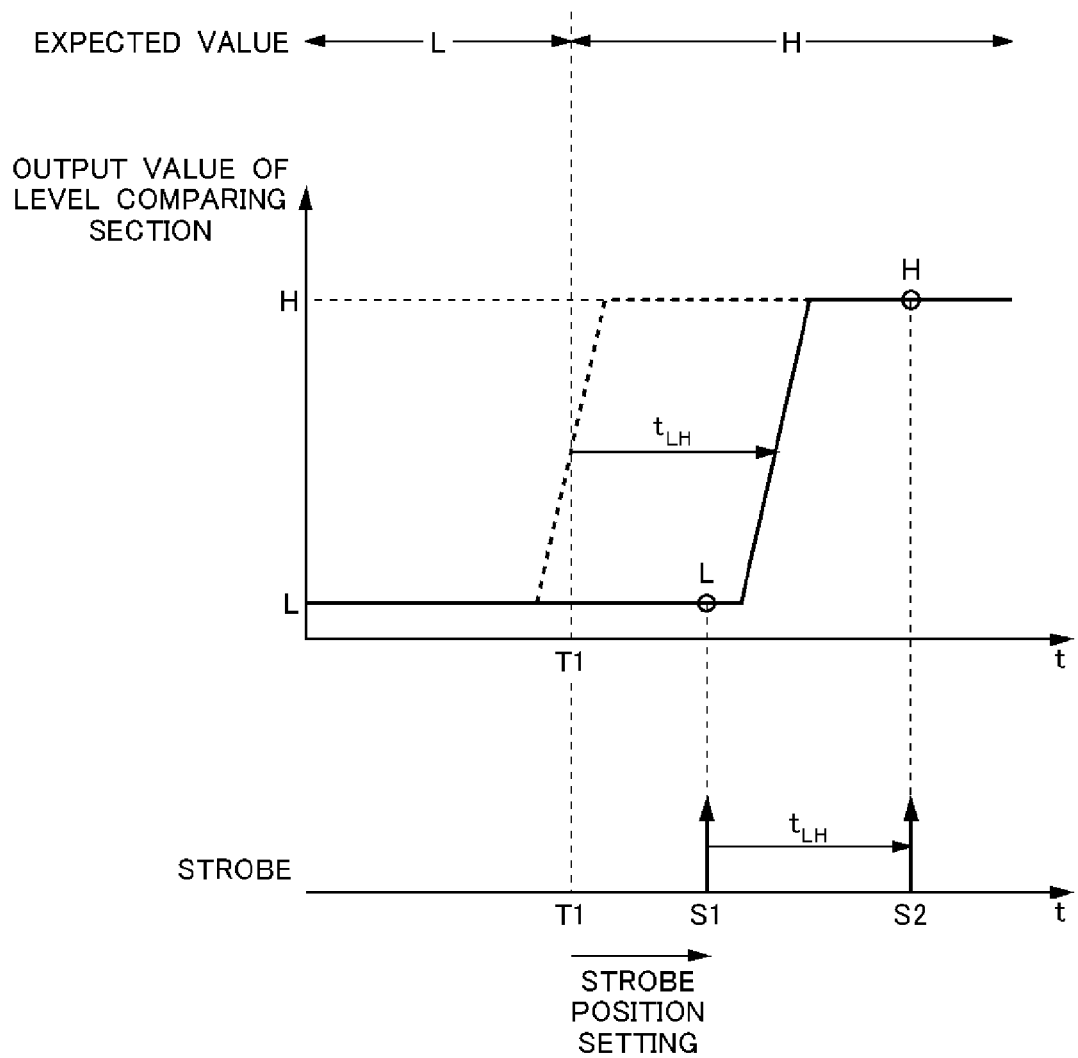
FIG. 3 shows an exemplary operation of the timing adjusting section 16.

FIG. 3 shows an exemplary operation of the timing adjusting section 16. FIG. 3 shows time positions of strobe signals and a waveform output by the level comparing section 14. The timing adjusting section 16 of the present embodiment compensates for the delay tLH of the level comparing section 14 by adjusting the delay amount of the strobe signal supplied to the timing comparing section 12.

In this example, the level of the signal under measurement input to the level comparing section 14 transitions from level L to level H at a timing T1. At this time, the logic value of the signal output by the level comparing section 14 transitions from logic L to logic H at a timing delayed by tLH from the timing T1.

The timing generating section 20 generates the strobe signal at the timing S1, which is delayed by a prescribed time from the timing T1, without referencing the delay t LH. However, when the delay tLH corresponding to the overdrive amount increases, the logic value output by the level comparing section 14 transitions at a timing even later than the timing S1.

In this case, the timing comparing section 12 acquires a logic value that differs from the logic value that should be acquired. To solve this problem, the test apparatus 100 accurately acquires the logic value by using the timing adjusting section 16 to adjust the timing of the strobe signal. The timing adjusting section 16 adjusts the timing of the strobe signal when the logic value of the expected value pattern transitions. In other words, the timing adjusting section 16 need not adjust the timing if the logic value of the expected value pattern does not transition, i.e. if the logic value of the signal under measurement does not transition.

The timing adjusting section 16 detects a timing T1 at which the logic value of the expected value pattern transitions. The overdrive amount of this transition can be calculated from the threshold level VTH and the signal level corresponding to the logic value of the expected value pattern after the transition.

The timing adjusting section 16 adjusts the relative phases of the comparison timing and the edge corresponding to the transition of the logic value of the expected value pattern in the signal output by the level comparing section 14, based on the logic value of the expected value pattern after the transition. For example, the timing adjusting section 16 may control the delay amount of the strobe signal generated by the timing generating section 20 in the test cycle corresponding to the transition, or may control the delay amount of the signal output by the level comparing section 14. The timing adjusting section 16 may be provided in advance with information that includes information concerning the signal level of each logic value of the signal under measurement.

For example, the timing adjusting section 16 may be provided in advance with information indicating the signal level of each logic value of the signal under measurement and information indicating the relationship between the overdrive amount and the delay amount of the level comparing section 14. In this case, the timing adjusting section 16 calculates the overdrive amount based on the difference between the threshold level VTH and the signal level corresponding to the logic value of the expected value pattern after the transition. The delay amount off the level comparing section 14 may then be calculated based on the calculated overdrive amount. The timing adjusting section 16 controls the delay amount of the strobe signal based on the calculated delay amount.

The timing adjusting section 16 may be provided in advance with information concerning the delay amount to be applied to the strobe signal for each logic value of the signal under measurement. This delay amount information may be calculated in advance by a user, based on information concerning the signal level of each logic value of the signal under measurement. In this case, the timing adjusting section 16 detects the delay amount corresponding to the logic value of the expected value pattern after the transition and delays the strobe signal.

With the process described above, the strobe signal is delayed by the delay amount tLH corresponding to the overdrive amount. Therefore, the delay of the level comparing section 14 caused by the overdrive is compensated for, and the logic value of the signal under measurement can be accurately detected.

Figure 4:
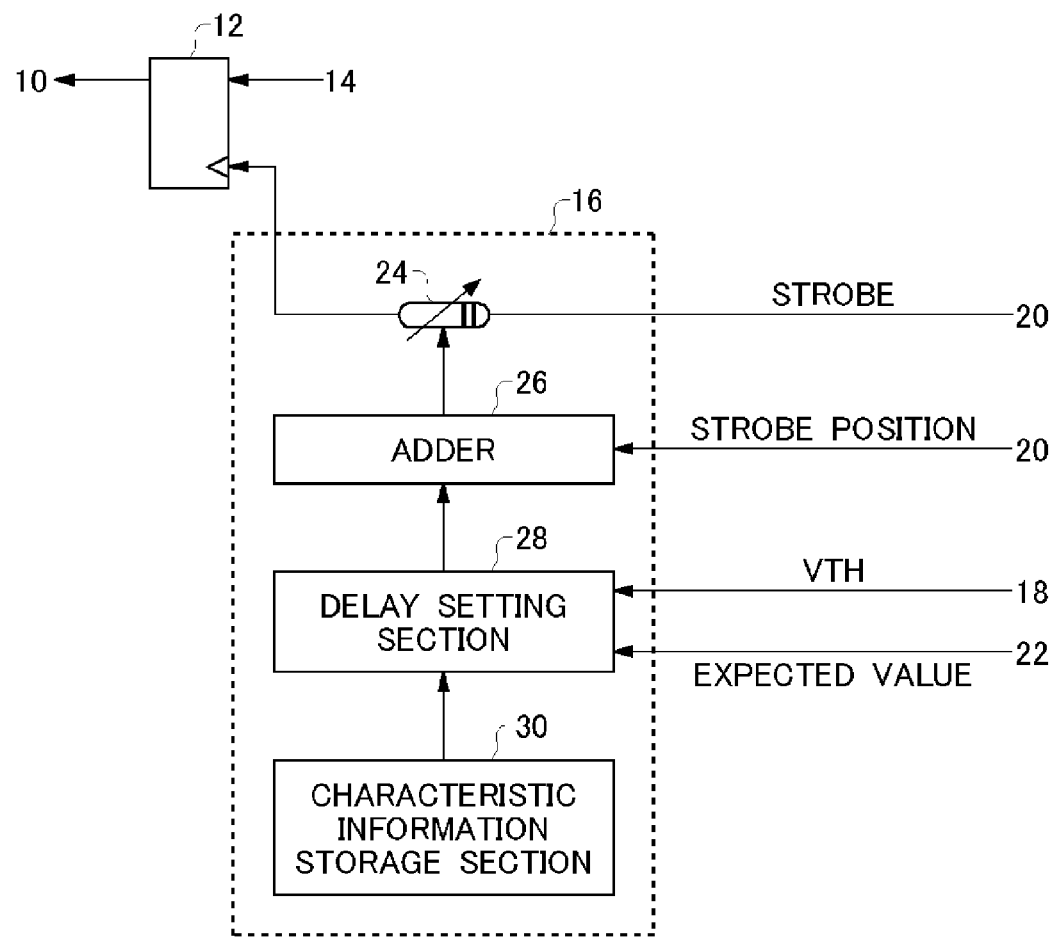
FIG. 4 shows an exemplary configuration of the timing adjusting section 16.

FIG. 4 shows an exemplary configuration of the timing adjusting section 16. The timing adjusting section 16 of the present embodiment includes a variable delay circuit 24, an adder 26, a delay setting section 28, and a characteristic information storage section 30. The variable delay circuit 24 delays at least one of the comparison timing input to the timing comparing section 12, i.e. the strobe signal, and the signal output by the level comparing section 14, according to the threshold level and the logic value of the expected value pattern. The variable delay circuit 24 of FIG. 4 delays the strobe signal.

The variable delay circuit 24 may be provided in the timing generating section 20. Other components of the timing adjusting section 16, i.e. the adder 26, the delay setting section 28, and the characteristic information storage section 30, may also be provided in the timing generating section 20. In other words, the timing generating section 20 may further function as the timing adjusting section 16.

The characteristic information storage section 30 is provided with characteristic information that indicates, for each logic value of the signal under measurement, a delay amount of the signal output by the level comparing section 14 due to the overdrive amount. The characteristic information storage section 30 is also provided with a delay setting value set for the strobe signal to compensate for the delay amount of the signal output by the level comparing section 14, for each logic value of the signal under measurement. If the threshold level VTH generated by the threshold level generating section 18 is variable, the information concerning these delay amounts is preferably provided in advance for each threshold level VTH.

The delay setting section 28 extracts the delay amount corresponding to the logic value of the expected value pattern after transition and the threshold level VTH from the characteristic information stored by the characteristic information storage section 30. The delay setting section 28 sets the setting value in the variable delay circuit 24, according to the extracted delay amount. More specifically, the delay setting section 28 supplies the adder 26 with the setting value corresponding to the extracted delay amount. The adder 26 adds the setting value received from the delay setting section 28 to the delay setting value of the strobe signal supplied from the timing generating section 20 as the initial setting, and sets the result as the delay amount of the variable delay circuit 24.

With the configuration described above, the strobe signal input to the timing comparing section 12 can be delayed to compensate for the delay amount caused by the overdrive of the level comparing section 14. Prior to inputting each bit of the signal under measurement into the level comparing section 14, the delay setting section 28 may read a corresponding bit of the expected value pattern. The delay setting section 28 may then calculate in advance the delay amount to be set in the variable delay circuit 24, at the timing at which the logic value of the expected value pattern transitions.

FIG. 5 shows exemplary characteristic information stored by the characteristic information storage section 30. As described above, the characteristic information storage section 30 stores, for each logic value of the signal under measurement (P1, P2, . . . , Pn) and each threshold level (VTH1, VTH2, . . . , VTHm), a setting value (D11, D12, . . . , D1m, . . . , Dnm) of the delay amount to be set for the strobe signal. The delay setting section 28 extracts the delay setting value corresponding to the logic value of the received expected value pattern after the transition and to the threshold level VTH at the time when the expected value pattern transitions.

Figure 6:
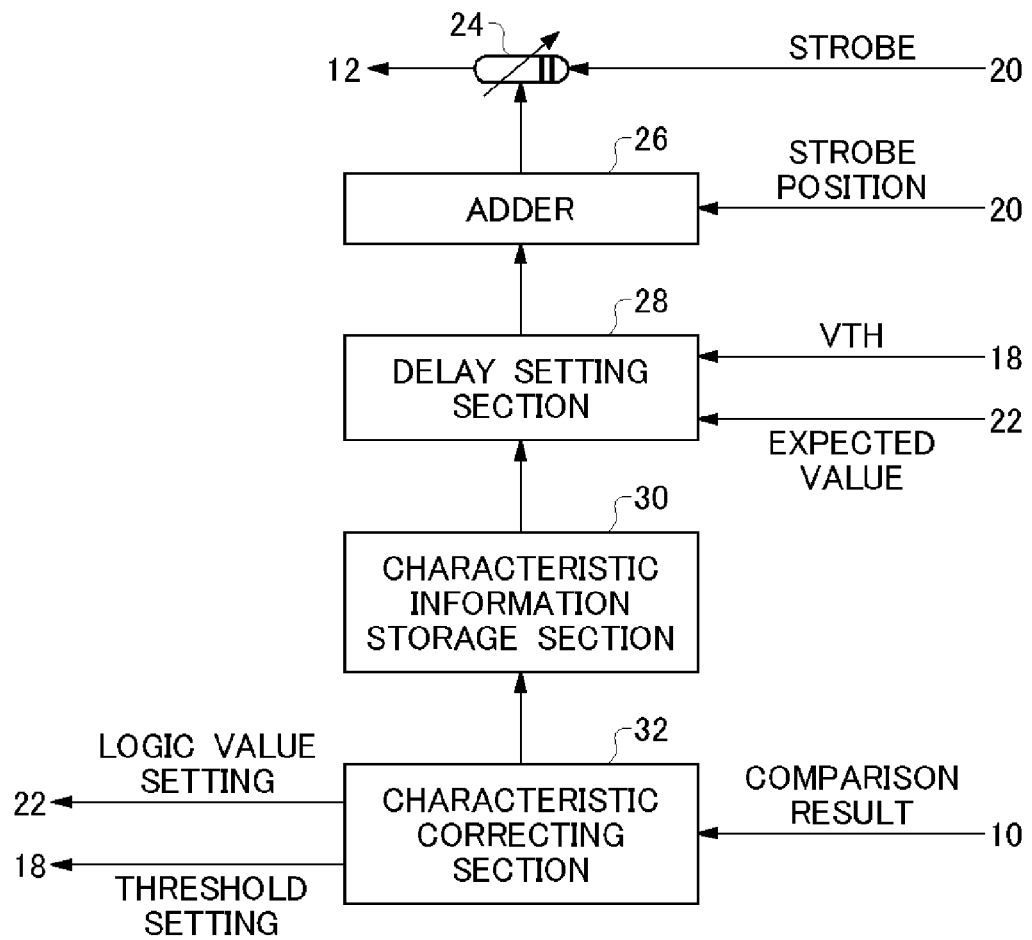
FIG. 6 shows another exemplary configuration of the timing adjusting section 16.

FIG. 6 shows another exemplary configuration of the timing adjusting section 16. The timing adjusting section 16 of the present embodiment includes a characteristic correcting section 32 in addition to the configuration of the timing adjusting section 16 described in relation to FIG. 4. The characteristic correcting section 32 measures the signal level of the signal under measurement in advance for each logic value, and corrects the value of the delay amount in the characteristic information stored by the characteristic information storage section 30 based on the measured signal level of each logic value.

As described above, the overdrive amount of the level comparing section 14 is determined according to the difference between the signal level of the signal under measurement and the threshold level VTH. The characteristic information storage section 30 stores the delay amount of the strobe signal with the signal level of each logic value of the signal under measurement as a known level, but if there is an error in this signal level, an error will also occur in the delay amount of the strobe signal.

The characteristic correcting section 32 corrects this error by measuring the actual signal level of each logic value of the signal under measurement. The characteristic correcting section 32 may be provided in advance with information indicating a relationship between the overdrive amount and the delay amount of the level comparing section 14. The delay amount of the level comparing section 14 may be calculated for each logic value of the signal under measurement, based on the signal level measured for each logic value of the signal under measurement. The characteristic correcting section 32 may update the corresponding delay amount in the characteristic information stored by the characteristic information storage section 30, based on the calculated delay amount.

The characteristic correcting section 32 may input the signal under measurement having a known logic value into the level comparing section 14, and measure the signal level of the signal under measurement having this logic value by sequentially changing the threshold level VTH of the level comparing section 14. More specifically, the characteristic correcting section 32 may cause the pattern generating section 22 to generate a test pattern having a prescribed logic value, and input this test pattern to the level comparing section 14. The test apparatus 100 may include a path through which the signal output by the pattern generating section 22 is input to the level comparing section 14.

The characteristic correcting section 32 sequentially changes the threshold level VTH generated by the threshold level generating section 18. The characteristic correcting section 32 detects the signal level of the signal input to the level comparing section 14, based on the comparison results of the digital comparing section 10. With this process, the signal level can be measured for each logic value of the signal under measurement.

Figure 7:
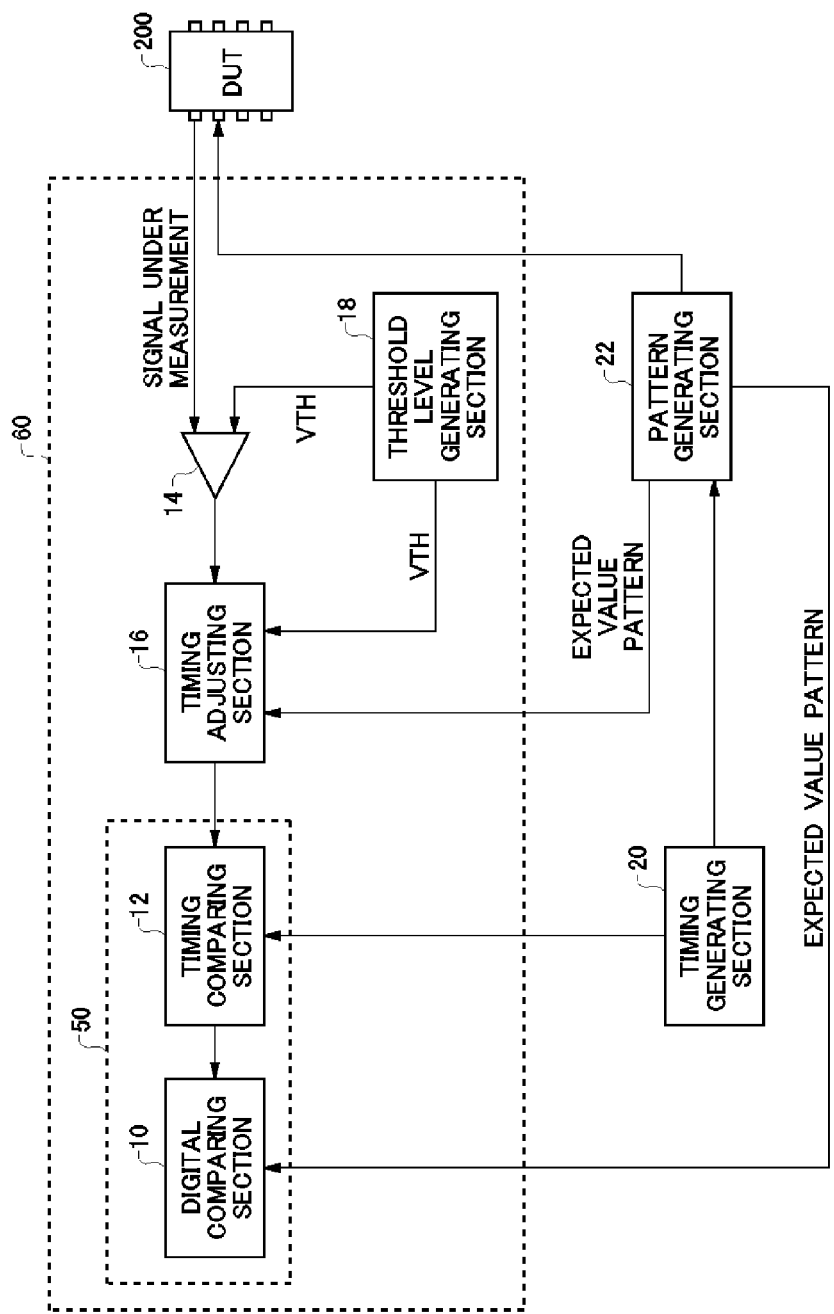
FIG. 7 shows another exemplary configuration of the measurement circuit 60.

FIG. 7 shows another exemplary configuration of the measurement circuit 60. The timing adjusting section 16 of the present embodiment delays the signal output by the level comparing section 14, based on the logic value of the expected value pattern and the threshold level VTH, and supplies the delayed signal to the timing comparing section 12.

In this case, the timing adjusting section 16 delays the output signal of the level comparing section 14 by a larger amount when the delay amount of the level comparing section 14 is smaller, and delays the output signal of the level comparing section 14 by a smaller amount when the delay amount of the level comparing section 14 is larger. As a result, the delay of the level comparing section 14 caused by the overdrive can be compensated for. Furthermore, the timing adjusting section 16 may compensate for the delay of the level comparing section 14 by controlling the delay amount of both the signal output by the level comparing section 14 and the strobe signal.

Figure 8:
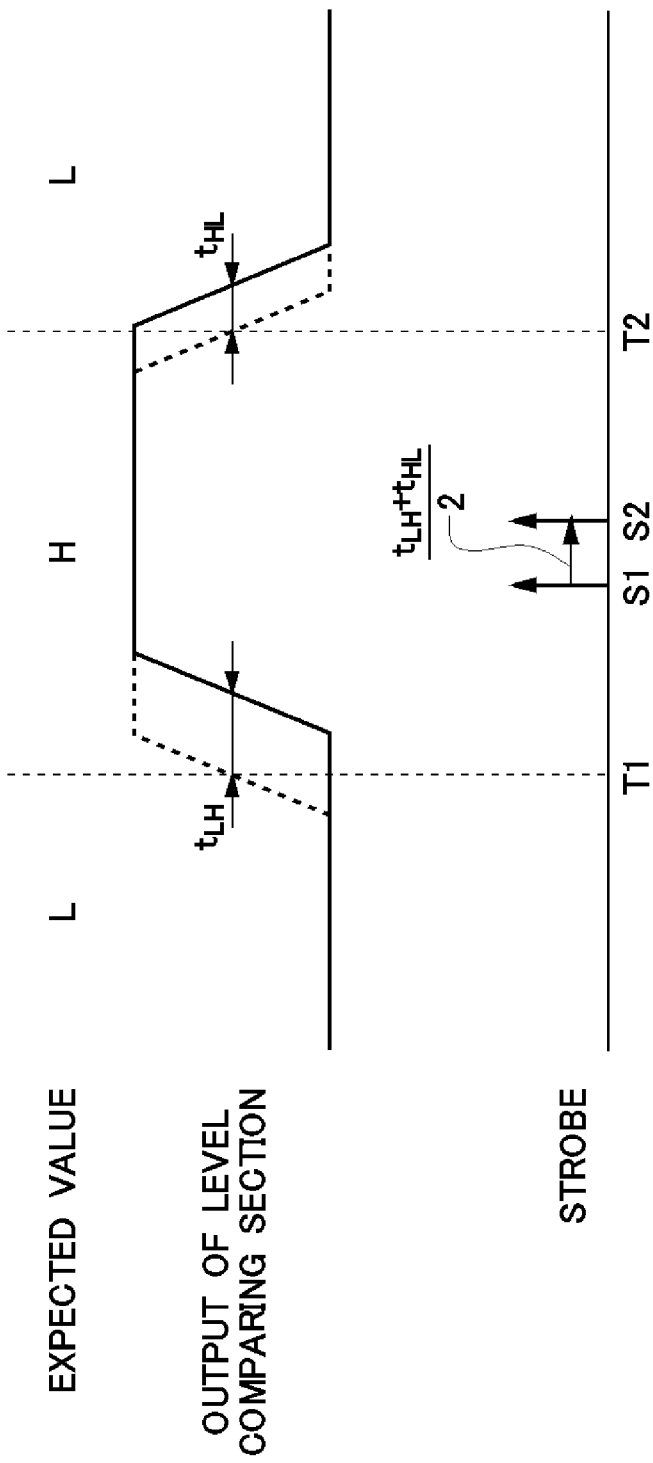
FIG. 8 shows an exemplary operation of the timing adjusting section 16.

FIG. 8 shows an exemplary operation of the timing adjusting section 16. The timing adjusting section 16 adjusts the relative phases of the signal output by the level comparing section 14 and the comparison timing between a first transition and a second transition of the logic value of the expected value pattern. The timing adjusting section 16 of the present embodiment adjusts the time position of the strobe signal, in a test cycle between the first transition and the second transition of the logic value of the expected value pattern.

In this example, at the timing T1, the logic value of the expected value pattern transitions from logic L to logic H (the first transition). At the timing T2, the logic value of the expected value pattern transitions from logic H to logic L (the second transition). The timing adjusting section 16 adjusts the timing of the strobe signal in the test cycle between the first transition and the second transition based on the logic value of the expected value pattern after the first transition, which is logic H in this example, the logic value of the expected value pattern after the second transition, which is logic L in this example, and the threshold level used during each transition.

More specifically, the timing adjusting section 16 delays the strobe signal using an average value of the delay amount tLH extracted from the characteristic information storage section 30 based on the threshold level and the logic value of the expected value pattern at the first transition and the delay value tHL extracted from the characteristic information storage section 30 based on the threshold level and the logic value of the expected value pattern at the second transition. As a result, the strobe can be arranged in the test cycle in the substantial center of an eye opening of the signal under measurement. It should be noted that the time position S1 of the strobe signal prior to correction is at the substantial center of the eye opening of the signal under measurement when the delay amount of the level comparing section 14 due to the overdrive is zero.

Figure 9:
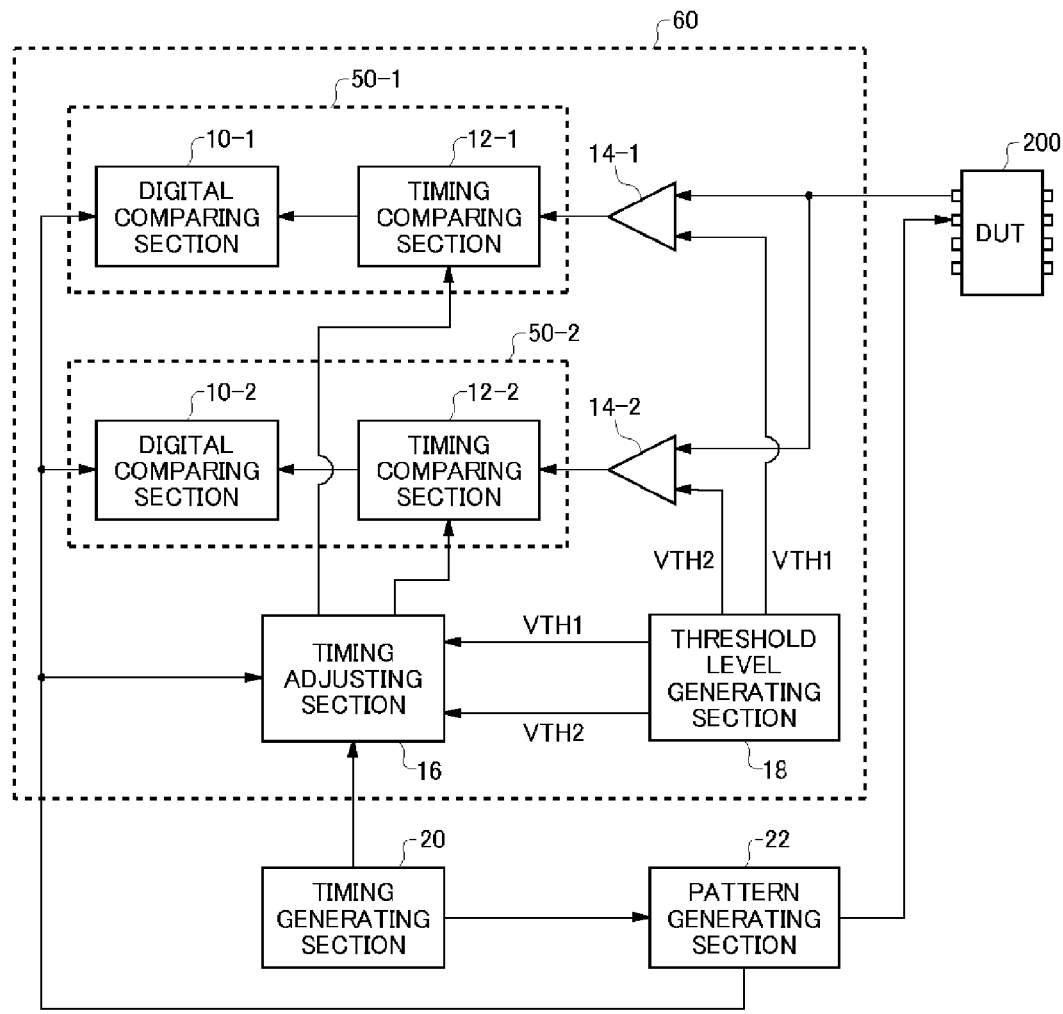
FIG. 9 shows another exemplary configuration of the measurement circuit 60.

FIG. 9 shows another exemplary configuration of the measurement circuit 60. The measurement circuit 60 of the present embodiment differs from the measurement circuit 60 described in relation to FIGS. 1 to 8 by including a plurality of level comparing sections 14-1 and 14-2, a plurality of timing comparing sections 12-1 and 12-2, and a plurality of digital comparing sections 10-1 and 10-2. The remaining configuration of the measurement circuit 60 may be the same as that of the measurement circuit 60 described in relation to FIGS. 1 to 8.

Each of the level comparing sections 14-1 and 14-2 receives a different threshold level from the threshold level generating section 18. Each of the level comparing sections 14-1 and 14-2 receives the same signal under measurement. The output of either the level comparing section 14-1 or the level comparing section 14-2 may be inverted.

Each of the timing comparing sections 12-1 and 12-2 samples the logic value of the signal output by the corresponding level comparing section 14-1 or 14-2, according to the strobe signal supplied from the timing adjusting section 16. The timing adjusting section 16 adjusts the relative phases of the comparison timing and the signals output by the level comparing sections 14-1 and 14-2, for each of the level comparing section 14-1 and 14-2, based on the corresponding expected value pattern and the corresponding threshold level.

The timing adjusting section 16 supplies the timing comparing sections 12-1 and 12-2 with strobe signals whose timing has been adjusted. The method by which the timing adjusting section 16 adjusts each strobe signal is the same as the method described in relation to FIGS. 1 to 8.

Each of the digital comparing sections 10-1 and 10-2 compares the logic pattern output by the corresponding timing comparing section 12-1 or 12-2 to the corresponding expected value pattern. With this configuration, when measuring the eye opening of the signal under measurement, for example, the variation in the delays caused by the level comparing sections 14-1 and 14-2 can be compensated for.

Figure 10:
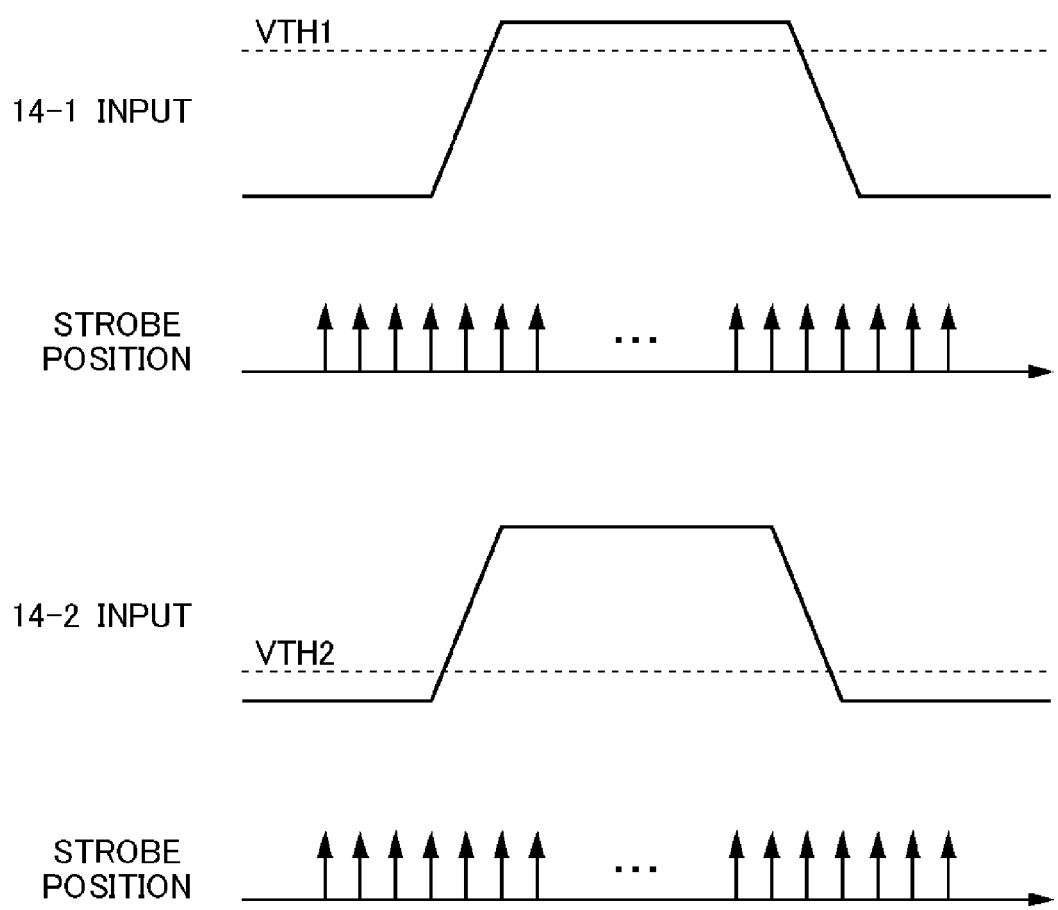
FIG. 10 shows an exemplary operation of the test apparatus 100 shown in FIG. 9.

FIG. 10 shows an exemplary operation of the test apparatus 100 shown in FIG. 9. The level comparing section 14-1 receives a threshold level VTH1 and the level comparing section 14-2 receives a threshold level VTH2, which is less than the threshold level VTH1. The threshold level VTH1 may be approximately 80% of the signal level when the signal under measurement is logic H and the threshold level VTH2 may be approximately 20% of the signal level when the signal under measurement is logic H, for example.

As shown in FIG. 10, the level comparing sections 14-1 and 14-2 each repeatedly receive a signal under measurement having a rising edge and a falling edge. The pattern generating section 22 may repeatedly generate a test pattern that causes the device under test 200 to output this signal under measurement.

Each time the pattern generating section 22 generates a prescribed number of repetitions of this test pattern, the timing generating section 20 shifts the time position of the strobe signal relative to the waveform of the signal under measurement. The logic comparing section 50 compares the logic value of the signal under measurement to the prescribed expected value, at each strobe position. With this operation, the eye opening, which indicates a time range in which the logic value of the signal under measurement matches the expected value, can be measured.

If the delay amount caused by the overdrive is different in the level comparing section 14-1 than in the level comparing section 14-2 when measuring the eye opening of the signal under measurement, the eye opening cannot be accurately measured. The level comparing sections 14-1 and 14-2 of the present embodiment each have different threshold levels and different signal levels measured for the signal under measurement, and therefore have different overdrive amounts. However, the timing adjusting section 16 compensates for the delays caused by the overdrive in the level comparing sections 14-1 and 14-2, and therefore the eye opening of the signal under measurement can be accurately measured.

Figure 11:
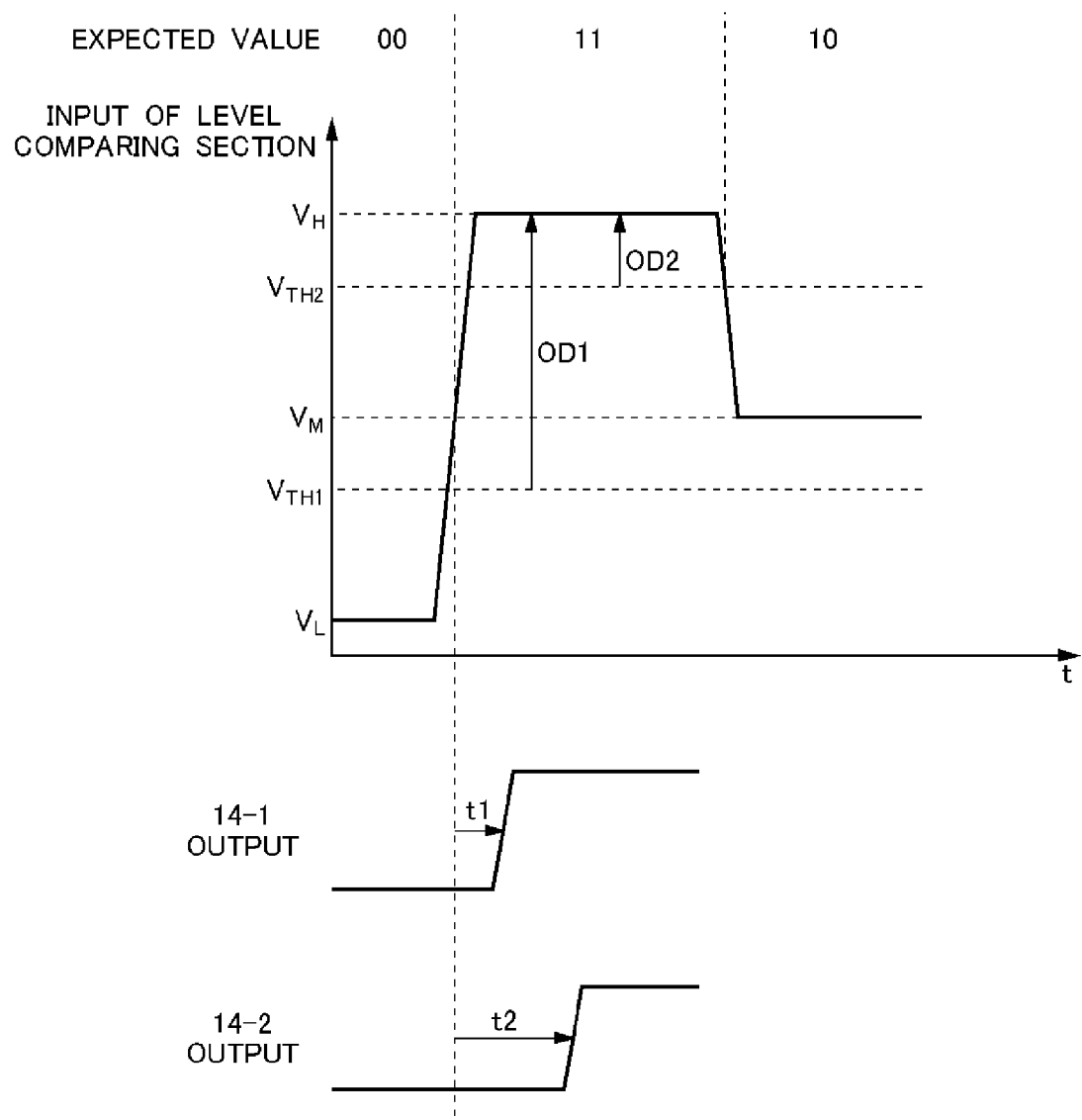
FIG. 11 shows another exemplary operation of the test apparatus shown in FIG. 9.

FIG. 11 shows another exemplary operation of the test apparatus shown in FIG. 9. The level comparing sections 14-1 and 14-2 of the present embodiment measure the signal under measurement together, without inversion. As a result, the level comparing sections 14-1 and 14-2 function as a multi-value comparing section that outputs three or more logic values corresponding to the comparison results between the signal level of the signal under measurement and a plurality of different threshold levels. In this case, a multi-valued logic value can be expressed by combining the logic values output by the level comparing sections 14-1 and 14-2, and therefore the delay amounts of the level comparing sections 14-1 and 14-2 are preferably the same.

When the signal level of the signal under measurement changes from VL to VH, as shown in FIG. 11 for example, the level comparing sections 14-1 and 14-2 each output a logic value of 1. However, since different threshold levels VTH1 and VTH2 are set respectively for the level comparing sections 14-1 and 14-2, the respective overdrive amounts OD1 and OD2 of the level comparing sections 14-1 and 14-2 are different. Therefore, the respective delay amounts t1 and t2 of the level comparing sections 14-1 and 14-2 are also different.

The timing adjusting section 16 adjusts the timing of the strobe signal based on the expected value pattern and the threshold level for each of the level comparing sections 14-1 and 14-2. Therefore, the logic comparing sections 50-1 and 50-2 can compensate for the variations in the delay amounts of the level comparing sections 14-1 and 14-2 and sample the logic value of the signal under measurement.

The timing adjusting section 16 adjusts the timing of the strobe signal when the logic value of the expected value pattern transitions. In other words, the timing adjusting section 16 need not adjust the timing if the logic value of the expected value pattern does not change, i.e. if the logic value of the signal under measurement does not change.

Furthermore, even when the logic value of the signal under measurement transitions, the timing adjusting section 16 need not adjust the timing of a level comparing section 14 if the signal level of the signal under measurement does not cross the threshold level of this level comparing section 14. In the example of FIG. 11, even though the expected value transitions from 11 to 10, the signal level of the signal under measurement does not cross the threshold level of the level comparing section 14-1. Therefore, the timing adjusting section 16 need not adjust the timing for the level comparing section 14-1.

Figure 12:
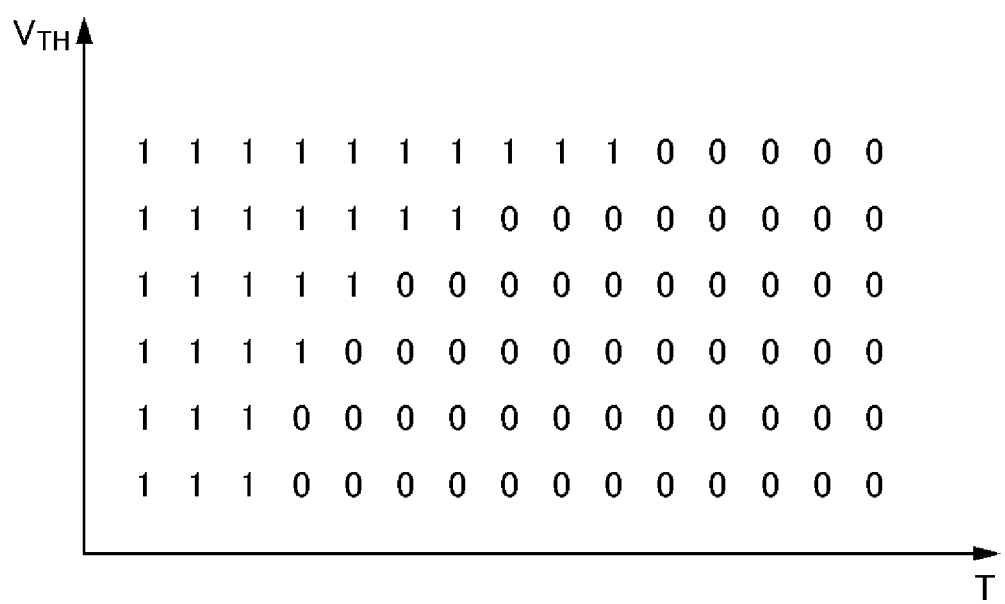
FIG. 12 shows another exemplary operation of the test apparatus 100 described in relation to FIG. 1.

FIG. 12 shows another exemplary operation of the test apparatus 100 described in relation to FIG. 1. In FIG. 12, the horizontal axis represents the timing of the strobe signal and the vertical axis represents the threshold level. The test apparatus 100 of the present embodiment causes the device under test 200 to repeatedly output the same signal under measurement. The threshold level generating section 18 sequentially changes the threshold level supplied to the level comparing section 14.

The timing generating section 20 sequentially changes the timing of the strobe signal. As a result, the timing comparing section 12 acquires the logic value while sequentially changing the relative timing of the comparison timing with respect to the signal under measurement.

The test apparatus 100 measures the signal under measurement a prescribed number of times for each combination of a strobe signal timing and a threshold level. In other words, the digital comparing section 10 generates, for each threshold level, a comparison result indicating whether the logic value of the signal under measurement matches the expected value at each relative timing. As a result, the test apparatus 100 can obtain a Shmoo plot indicating whether the logic value of the signal under measurement matches the expected value for each of the combinations of a strobe signal timing and a threshold level.

When obtaining this Shmoo plot, the overdrive amount of the level comparing section 14 sequentially changes due to the sequentially changing threshold level. The timing adjusting section 16 adjusts the timing of the strobe signal according to the threshold level generated by the threshold level generating section 18, and can therefore obtain an accurate Shmoo plot by compensating for the change in the delay amount of the level comparing section 14 caused by the change in the threshold level.

Figure 13:
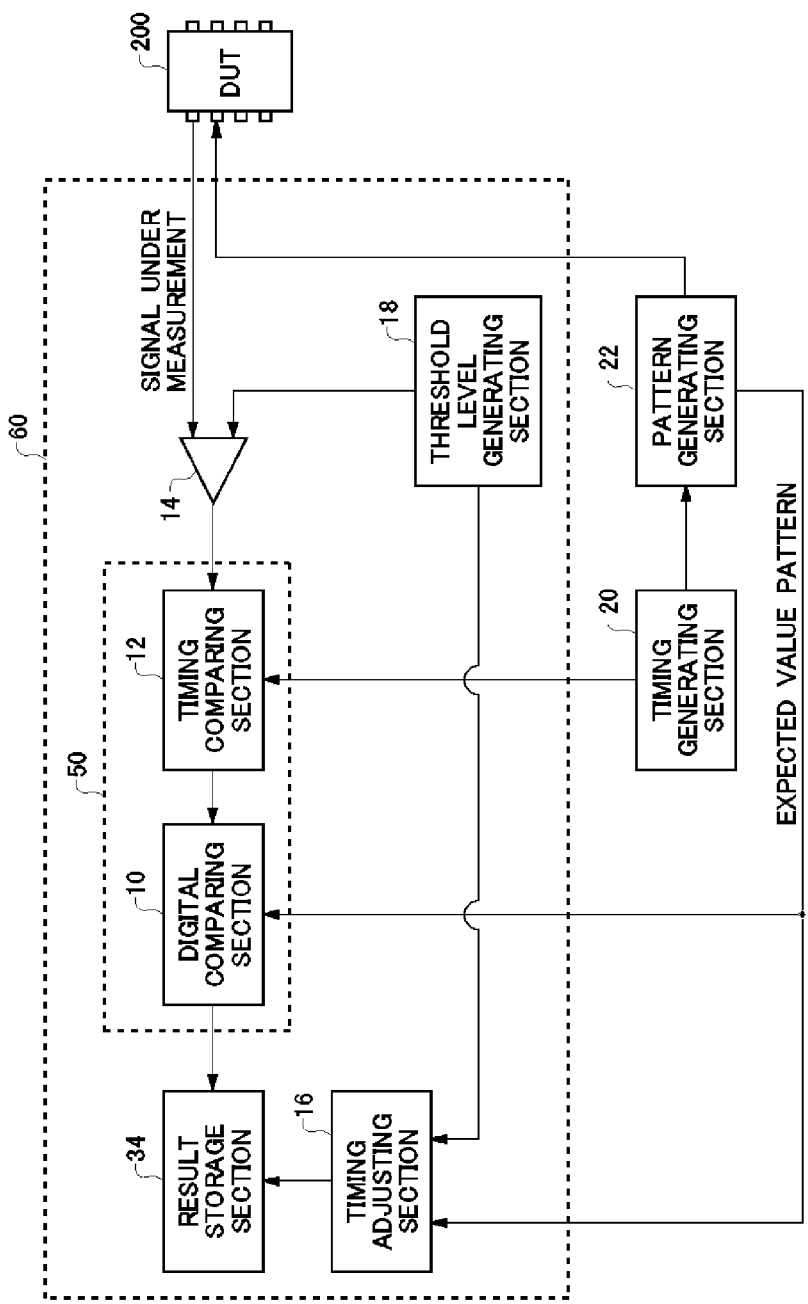
FIG. 13 shows another exemplary configuration of the measurement circuit 60.

FIG. 13 shows another exemplary configuration of the measurement circuit 60. The measurement circuit 60 described in relation to FIGS. 1 to 12 compensates for the delay in the level comparing section 14 caused by the overdrive by adjusting the delay amount of the strobe signal or the output signal of the level comparing section 14. In contrast, the measurement circuit 60 of the present embodiment compensates for the delay in the level comparing section 14 caused by the overdrive using a measurement result of the signal under measurement obtained previously.

The measurement circuit 60 of the present embodiment includes a level comparing section 14, a threshold level generating section 18, a logic comparing section 50, a timing adjusting section 16, and a result storage section 34. The level comparing section 14, the threshold level generating section 18, and the logic comparing section 50 may be the same as the level comparing section 14, the threshold level generating section 18, and the logic comparing section 50 described in relation to FIGS. 1 to 12.

The result storage section 34 stores comparison results between the logic value of the signal under measurement and the expected value pattern obtained by the digital comparing section 10. For example, as shown in the Shmoo plot described in relation to FIG. 12, the result storage section 34 may store comparison results between the logic value of the signal under measurement and the expected value pattern in association with timing information of the strobe signal.

The timing adjusting section 16 corrects the timing information corresponding to the comparison results stored in the result storage section 34, based on the threshold level generated by the threshold level generating section 18 and the expected value pattern generated by the pattern generating section 22. The timing adjusting section 16 may extract from the characteristic information storage section 30 the delay amount corresponding to a threshold level and a logic value of the expected value pattern. The timing adjusting section 16 may add or subtract the delay amount extracted from the characteristic information storage section 30 to or from the timing information of each comparison result of the result storage section 34.

Figure 14:
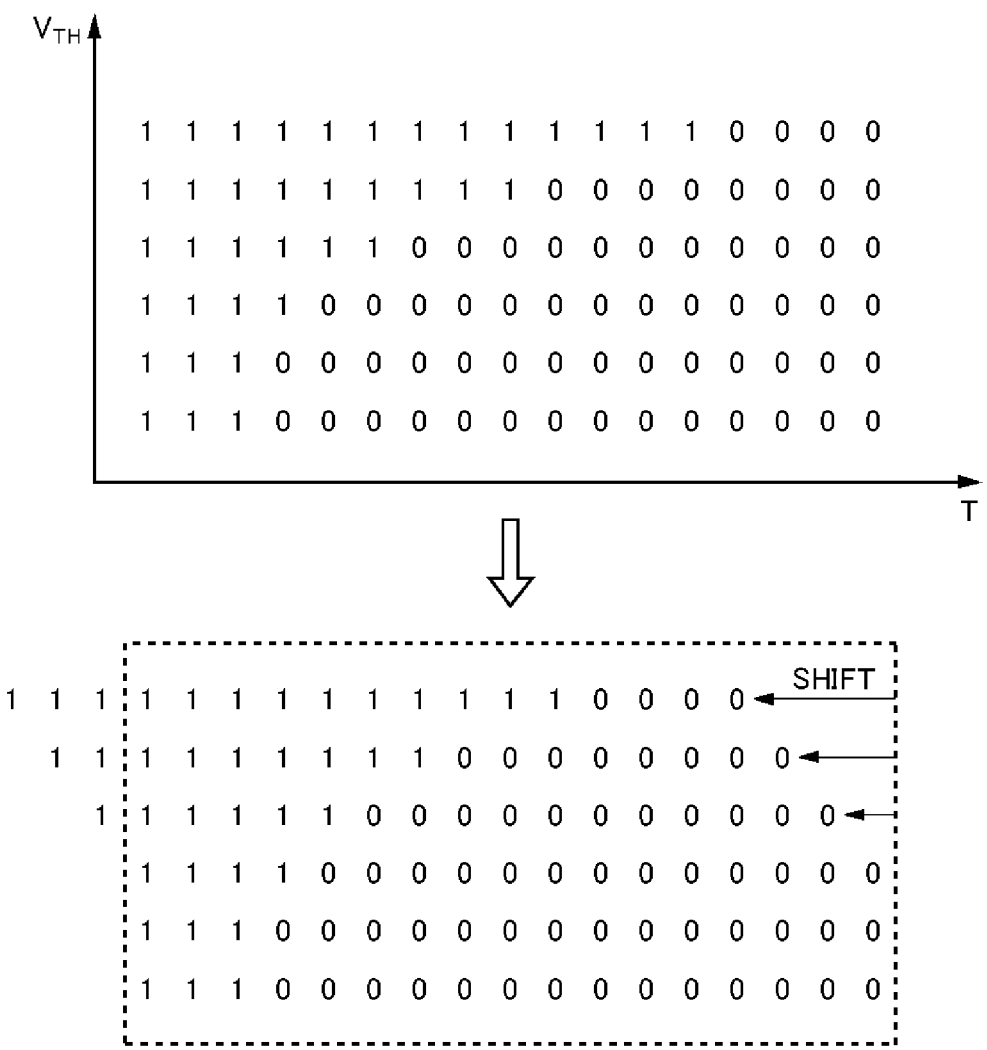
FIG. 14 shows an exemplary configuration of the timing adjusting section 16 shown in FIG. 13.

FIG. 14 shows an exemplary configuration of the timing adjusting section 16 shown in FIG. 13. The upper portion of FIG. 14 shows Shmoo plot data stored by the result storage section 34 and the lower portion of FIG. 14 shows Shmoo plot data resulting from the timing information corrected by the timing adjusting section 16.

The timing adjusting section 16 corrects the timing information of the comparison result for each threshold level, based on the expected value pattern and the threshold level. The timing adjusting section 16 of the present embodiment calculates, for the Shmoo plot data, a value to be added to or subtracted from the timing information for each value of the threshold level VTH. As a result, the comparison results (1/0) in the Shmoo plot data have their timing information shifted for each threshold level.

With this process, the delay of the level comparing section 14 caused by the overdrive amount can be compensated for based on the measurement results. Therefore, the measurement results of the signal under measurement can be accurately acquired.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement circuit that measures a signal under measurement input thereto, comprising:
   a level comparing section that outputs a logic value according to a comparison result between a signal level of the signal under measurement and a set threshold level;
   a logic comparing section that acquires the logic value output by the level comparing section at a comparison timing input thereto; and
   a timing adjusting section that adjusts relative phases of a signal output by the level comparing section and the comparison timing, based on an expected value pattern of the signal under measurement and the threshold level, the timing adjusting section including:
      a variable delay circuit that delays at least one of the comparison timing input to the logic comparing section and the signal output by the level comparing section, according to a logic value of the expected value pattern and the threshold level,
      a characteristic information storage section that is supplied with characteristic information indicating, for each logic value of the signal under measurement, a delay amount of the signal output by the level comparing section caused by a difference between the threshold level and the signal level of the signal under measurement input to the level comparing section, and
      a delay setting section that sets a delay amount in the variable delay circuit based on the delay amount corresponding to the logic value of the expected value pattern in the characteristic information.

2. The measurement circuit according to claim 1, wherein the logic comparing section further compares a logic value pattern acquired at the comparison timing to the expected value pattern input thereto.

3. The measurement circuit according to claim 2, further comprising a characteristic correcting section that measure the signal level of the signal under measurement in advance for each logic value, and corrects a value of the delay amount for each logic value in the characteristic information stored by the characteristic information storage section, based on the signal level measured for each logic value.

4. The measurement circuit according to claim 3, wherein the characteristic correcting section inputs the signal under measurement with a known logic value into the level comparing section and measures the signal level of the signal under measurement having this logic value by sequentially changing the threshold level in the level comparing section.

5. The measurement circuit according to claim 1, wherein when the logic value of the expected value pattern transitions, the timing adjusting section adjusts the relative phases of the comparison timing and the signal output by the level comparing section, based on the threshold level and the logic value of the expected value pattern after the transition.

6. The measurement circuit according to claim 5, wherein the timing adjusting section adjusts the relative phases of the comparison timing and an edge corresponding to the transition of the logic value of the expected value pattern in the signal output from the level comparing section.

7. The measurement circuit according to claim 5, wherein the timing adjusting section adjusts the relative phases of the signal output by the level comparing section and the comparison timing between a first transition and a second transition of the logic value of the expected value pattern, based on the threshold level and the logic value of the expected value pattern after the first transition and the threshold level and the logic value of the expected value pattern after the second transition.

8. The measurement circuit according to claim 1, comprising a plurality of the level comparing sections, wherein each level comparing section has a different threshold level and receives the same signal under measurement, and the timing adjusting section adjusts, for each level comparing section, the relative phases of the comparison timing and the signal output by the level comparing section, based on the expected value pattern and the corresponding threshold level.

9. The measurement circuit according to claim 1, wherein the level comparing section outputs three or more different logic values corresponding to comparison results between the signal level of the signal under measurement and a plurality of different threshold levels.

10. A test apparatus that tests a device under test, comprising:
   a pattern generating section that generates a test pattern signal to be input to the device under test; the measurement circuit according to claim 1 that measures a signal under measurement output by the device under test in response to the test pattern signal; and
   a judging section that judges pass/fail of the device under test based on a result of the measurement by the measurement circuit.

11. A measurement circuit that measures a signal under measurement input thereto, comprising:
   a level comparing section that outputs a logic value according to a comparison result between a signal level of the signal under measurement and a set threshold level;
   a logic comparing section that acquires the logic value output by the level comparing section at a comparison timing input thereto; and
   a timing adjusting section that corrects timing information of the comparison result from the logic comparing section, based on an expected value pattern of the signal under measurement and the threshold level, the timing adjusting section including:
      a variable delay circuit that delays at least one of the comparison timing input to the logic comparing section and the signal output by the level comparing section, according to a logic value of the expected value pattern and the threshold level,
      a characteristic information storage section that is supplied with characteristic information indicating, for each logic value of the signal under measurement, a delay amount of the signal output by the level comparing section caused by a difference between the threshold level and the signal level of the signal under measurement input to the level comparing section, and
      a delay setting section that sets a delay amount in the variable delay circuit based on the delay amount corresponding to the logic value of the expected value pattern in the characteristic information.

12. The measurement circuit according to claim 11, wherein the level comparing section sequentially changes the threshold level, the logic comparing section acquires the logic value while sequentially changing relative timing of the comparison timing with respect to the signal under measurement and generates, for each threshold level, a comparison result indicating whether the logic value of the signal under measurement matches the expected value for each relative timing, and the timing adjusting section corrects the timing information of the comparison result for each threshold level, based on the expected value pattern and the threshold level.

13. A test apparatus that tests a device under test, comprising:
   a pattern generating section that generates a test pattern signal to be input to the device under test;
   the measurement circuit according to claim 11 that measures a signal under measurement output by the device under test in response to the test pattern signal; and
   a judging section that judges pass/fail of the device under test based on a result of the measurement by the measurement circuit.

* * * * *